United States Patent
Jung et al.

(10) Patent No.: US 12,437,977 B2
(45) Date of Patent: Oct. 7, 2025

(54) METHOD FOR ETCHING LITHIUM NIOBATE AND METHOD FOR FORMING LITHIUM NIOBATE PATTERN USING THE SAME

(71) Applicants: Korea Institute of Science and Technology, Seoul (KR); KOREA ADVANCED INSTITUTE OF SCIENCE AND TECHNOLOGY, Daejeon (KR)

(72) Inventors: Ho Joong Jung, Seoul (KR); Sang Wook Han, Seoul (KR); Hyung Jun Heo, Seoul (KR); Hansuek Lee, Daejeon (KR); Min Kyo Seo, Daejeon (KR); Hyeon Hwang, Daejeon (KR)

(73) Assignees: KOREA INSTITUTE OF SCIENCE AND TECHNOLOGY, Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 325 days.

(21) Appl. No.: 18/114,295

(22) Filed: Feb. 27, 2023

(65) Prior Publication Data
US 2023/0307214 A1    Sep. 28, 2023

(30) Foreign Application Priority Data

Mar. 24, 2022 (KR) .......... 10-2022-0036633
Apr. 6, 2022 (KR) .......... 10-2022-0042690

(51) Int. Cl.
| H01J 37/32 | (2006.01) |
| B08B 3/08 | (2006.01) |
| G03F 7/20 | (2006.01) |

(52) U.S. Cl.
CPC .......... *H01J 37/32825* (2013.01); *B08B 3/08* (2013.01); *G03F 7/2026* (2013.01);
(Continued)

(58) Field of Classification Search
CPC .............. G03F 7/2026; B08B 3/08
See application file for complete search history.

(56) References Cited

U.S. PATENT DOCUMENTS

| 7,045,434 B2 * | 5/2006 | Hirase .......... H01L 23/544 |
| | | 257/E23.179 |
| 2004/0013386 A1 | 1/2004 | Bhowmik |

(Continued)

FOREIGN PATENT DOCUMENTS

| CN | 111505767 A | 8/2020 |
| CN | 112782805 A * | 5/2021 .......... G02B 6/124 |

(Continued)

OTHER PUBLICATIONS

Korean Office Action issued on Jul. 2, 2024, in counterpart Korean Patent Application No. 10-2022-0042690 (1 pages in English, 7 pages in Korean).

(Continued)

*Primary Examiner* — Binh X Tran
(74) *Attorney, Agent, or Firm* — NSIP Law

(57) ABSTRACT

The present invention relates to a method for etching lithium niobate, the method including a process of etching lithium niobate using a mask pattern as a physical dry etching method using Ar plasma produced in a chamber through Ar gas, wherein in the process of etching lithium niobate, a process pressure of the chamber is maintained at 1 mTorr to 20 mTorr, and a method for forming a lithium niobate pattern using the same.

14 Claims, 11 Drawing Sheets

(52) U.S. Cl.
CPC ..... *H01J 37/32449* (2013.01); *H01J 37/3266* (2013.01); *H01J 2237/022* (2013.01); *H01J 2237/182* (2013.01); *H01J 2237/3321* (2013.01); *H01J 2237/3343* (2013.01)

(56) References Cited

U.S. PATENT DOCUMENTS

2020/0144063 A1    5/2020  Lee et al.
2021/0405399 A1*  12/2021  Teo .................... G02F 1/035

FOREIGN PATENT DOCUMENTS

| JP | 2006-80421 A | | 3/2006 |
|---|---|---|---|
| JP | 2013077665 A | * | 4/2013 |
| KR | 10-2001-0087195 A | | 9/2001 |
| KR | 10-2006-0065016 A | | 6/2006 |
| KR | 10-2012-0016176 A | | 2/2012 |

OTHER PUBLICATIONS

Arizmendi et al. "Defects induced in pure and doped LiNbO3 by irradiation and thermal reduction" *Journal of Physics C: Solid State Physics* vol. 17 No. 3, 1984 (pp. 515-529).

Ren et al. "Etching characteristics of LiNbO3 in reactive ion etching and inductively coupled plasma" *Journal of applied physics* vol. 103 No. 3. Feb. 12, 2008. Issue 034109 (pp. 1-9).

Ulliac et al. "Argon plasma inductively coupled plasma reactive ion etching study for smooth sidewall thin film lithium niobate waveguide application" *Optical Materials* vol. 53, Jan. 6, 2016 (pp. 1-5).

* cited by examiner

Etching rate $R_{etch} = \dfrac{T_{etch}}{\text{Etch time}}$

Estimated value $= 32.1 P\, e^{-0.203P}, P : pressure$ (a)　　　　　　　　　(b)

W/o　　　500°C　　　700°C　　　900°C

Chamber internal pressure graph (a) (b)

METHOD FOR ETCHING LITHIUM NIOBATE AND METHOD FOR FORMING LITHIUM NIOBATE PATTERN USING THE SAME

CROSS-REFERENCE TO RELATED APPLICATIONS

This application claims the benefit under 35 USC 119(a) of Korean Patent Application Nos. 10-2022-0036633 filed on Mar. 24, 2022, and 10-2022-0042690 filed on Apr. 6, 2022, in the Korean Intellectual Property Office, the entire disclosures of which are incorporated herein by reference for all purposes.

BACKGROUND

1. Field of the Invention

The present invention relates to a method for etching lithium niobate ($LiNbO_3$) and a method for forming a lithium niobate pattern using the same, and more particularly, to a method for etching lithium niobate at a low bias voltage through physical dry etching of large-area lithium niobate and a method for forming a high-quality lithium niobate pattern using the same.

2. Discussion of Related Art

Lithium niobate ($LiNbO_3$) materials exhibit physically or chemically stable characteristics in a real environment and have low optical loss characteristics in a wide band. Further, lithium niobate materials have the potential to be applied to various functional devices due to an electro-optical effect, piezoelectric effect, acousto-optical effect, and the like.

Due to these advantages, interest in lithium niobate is increasing, and recently, with the development of a technique of preparing a lithium niobate thin film, there is an opportunity to manufacture various optical functional devices with high integration through a patterning and etching technique.

Various chemical or physical etching techniques have been tried as etching techniques for etching lithium niobate. In particular, since a radioactive ion etching (RIE) etching technique, which can be applied to a large area, enables easy process condition control, can perform anisotropic etching, and is used to manufacture highly integrated devices, has high productivity, precision, and reproducibility, efforts have been made to apply the RIE etching technique to a technique of etching a lithium niobate thin film.

The lithium niobate etching method using the RIE etching method in the related art has been performed by mixing a reactive compound gas ($SF_6$, $CF_4$, $CHF_3$, $Cl_2$, $BCl_3$ and the like) including a halogen (Group 17) element with an inert gas (Ar, He) to appropriately mix chemical etching and physical etching.

However, to apply the RIE etching technique in the related art to the lithium niobate thin film etching process, there is a problem in that a very high bias voltage is required and the etching rate is very slow, and furthermore, there is a problem in that the surface roughness of an etched surface is increased and the etched surface is contaminated. It is known that the main cause of such problems is because a large amount of non-volatile by-products such as LiF and LiCl are generated in the chemical etching reaction, which is the main mechanism of RIE etching technique to form a protective layer on the etched surface.

To solve these problems, a reactive gas etching technique using a proton-exchange method has been proposed (see Non-Patent Document 1). This proposed etching technique forms $Li_{x-1}H_xNbO_3$ by a preceding process of substituting Li atoms in a substrate with H atoms through the proton exchange method to perform etching, thereby lowering the proportion of Li to reduce non-volatile products caused by chemical etching. Through this, a sufficient etching rate may be secured and the degree of contamination of the etched surface may be reduced. However, such related art weakens the excellent material properties of $LiNbO_3$ (high optical nonlinearity, wide transmittance, electro-optical modulation properties, and the like) and causes unstable material properties.

As another related art, an etching technique of increasing the specific gravity of the physical etching reaction by greatly increasing the specific gravity of Ar, which is an inert gas, compared to that of the reactive gas has been proposed (see Patent Documents 1 and 2). In the proposed related art, etching rate and material properties may be appropriately maintained by removing byproducts (LiF, LiCl) produced by chemical reactions using accelerated Ar ions. However, when a physical etching method using Ar is used as the main mechanism, there is a disadvantage in that a high RIE bias voltage is required because a higher acceleration energy is required.

In addition, since the etching technology in the related art, whose main mechanism is to increase the specific gravity of Ar, is not an etching process that uses a selective etching reaction of materials, a harder or thicker mask material is required. At this time, as a mask material, a metal mask of a metal series (Cr, Al, Ni) is used, or a mask material consisting of silicon dioxide ($SiO_2$) is used. The metal mask has high selectivity, but requires an additional process for metal patterning and the roughness of the pattern and an etched surface is poor. Moreover, although a mask consisting of silicon dioxide provides lower optical loss by forming an etched surface and a material interface to be smoother than a metal mask, there is a problem in that additional processes for thick deposition and patterning are increased.

RELATED ART DOCUMENTS

Patent Documents (Patent Document 1) US 2004/0013386 A1, 2004 Jan. 22, "Optical device and method of manufacture thereof"
(Patent Document 2) CN 111505767 A, 2020 Aug. 7, "Preparation method of lithium niobate photon chip based on silicon oxide mask"

Non-Patent Documents (Non-Patent Document 1) Ren, Z., et al. "Etching characteristics of LiNbO3 in reactive ion etching and inductively coupled plasma." Journal of applied physics 103.3 (2008)

SUMMARY OF THE INVENTION

Therefore, an object of the present invention is to provide a method for etching lithium niobate, which is capable of completely excluding a chemical reaction caused by reactive compound gases ($SF_6$, $CF_4$, $CHF_3$, $Cl_2$, $BCl_3$, and the like) including halogen elements that produce non-volatile impurities.

Furthermore, another object of the present invention is to provide a method for etching lithium niobate, which is capable of simplifying a process while solving the problems of the related art, which implements a rough etched surface using a metal mask, and securing a smooth pattern and etched surface comparable to those of silicon dioxide.

Further, still another object of the present invention is to implement a high-quality lithium niobate pattern by selectively removing a redeposited layer formed by byproducts during an etching process of lithium niobate.

In addition, yet another object of the present invention is to provide a method for forming a lithium niobate pattern, which provides a high-quality lithium niobate pattern by restoring changes in physical properties (color change, and the like) caused by damage during an etching process of lithium niobate.

Furthermore, yet another object of the present invention is to provide a method for forming a lithium niobate pattern, which is capable of simultaneously implementing the selective removal of the above-described redeposited layer and the restoration of changes in physical properties of lithium niobate by a simplified process.

According to an aspect for achieving the aforementioned objects, the present invention provides a method for etching lithium niobate, the method including a process of etching lithium niobate using a mask pattern, as a physical dry etching method using Ar plasma produced in a chamber through Ar gas, in which in the process of etching lithium niobate, wherein the process pressure of the chamber is maintained at 1 mTorr to 20 mTorr.

Further, according to another aspect of the aforementioned objects, the present invention provides a method for etching lithium niobate, the method including a process of etching lithium niobate using a mask pattern, as a physical dry etching method using Ar plasma produced in a chamber through a mixed gas in which Ar gas and $O_2$ gas are mixed at a volume ratio of 1:0.5 to 1:2, in which in the process of etching lithium niobate, wherein the process pressure of the chamber is maintained at 1 mTorr and less than 20 mTorr.

In addition, the method for etching lithium niobate may further include a process of forming a mask pattern on the lithium niobate.

Furthermore, the mask pattern may include an HSQ resist.

Further, the mask pattern may include an HSQ resist coated on the top of the lithium niobate and a conductive layer thin film formed on the top of the HSQ resist.

In addition, the process of forming the mask pattern may include: a process of forming an adhesive film on the lithium niobate; a process of spin-coating an HSQ resist on the adhesive film; a process of forming a conductive layer thin film by spin-coating a conductive layer solution on the HSQ resist; a process of patterning the conductive layer thin film and the HSQ resist; and a process of developing the conductive layer thin film and the HSQ resist.

Furthermore, the process of forming the mask pattern may further include a process of treating the surface of the adhesive film with $O_2$ plasma after the process of forming the adhesive film; and a process of heating the HSQ resist using a hot plate after the process of spin-coating the HSQ resist.

Further, the adhesive film may be formed as a silicon dioxide film ($SiO_2$) using a plasma-enhanced chemical vapor deposition (PECVD) method.

In addition, the process of etching lithium niobate may be performed using ICP etching equipment, and in this case, the ICP power may be 300 W to 1000 W, and the bias power may be 50 W to 300 W.

Furthermore, the process of etching lithium niobate may be performed using magnetron plasma etching equipment, and in this case, the electromagnetic intensity may be 10 Gauss to 70 Gauss, and the bias power may be 50 W to 300 W.

Further, the method may further include a process of stabilizing the chamber by performing a multiple Ar purge process prior to the process of etching lithium niobate.

In addition, the multiple Ar purge process may include: a process of operating a vacuum pump under atmospheric pressure conditions, and then injecting Ar gas until the chamber internal pressure becomes 100 Torr, and then repeatedly performing an Ar purge process of operating the vacuum pump at least three times; and a process of injecting Ar gas up to the process pressure.

Furthermore, according to still another aspect of the aforementioned objects, the present invention provides a method for forming a lithium niobate pattern, the method including: a process of forming a lithium niobate pattern using the above-described method for etching lithium niobate; and a cleaning process of removing a redeposited layer in which byproducts generated in the process of forming the lithium niobate pattern are redeposited on the lithium niobate pattern. Further, the cleaning process may be performed using a KOH aqueous solution.

In addition, the method may further include a process of restoring the transparency of the lithium niobate, which is changed by damage caused during the process of etching lithium niobate, by performing a heat treatment process after the process of forming the lithium niobate pattern.

Furthermore, the heat treatment process may be performed at 500° C. to 900° C. in an $O_2$ flow gas environment.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
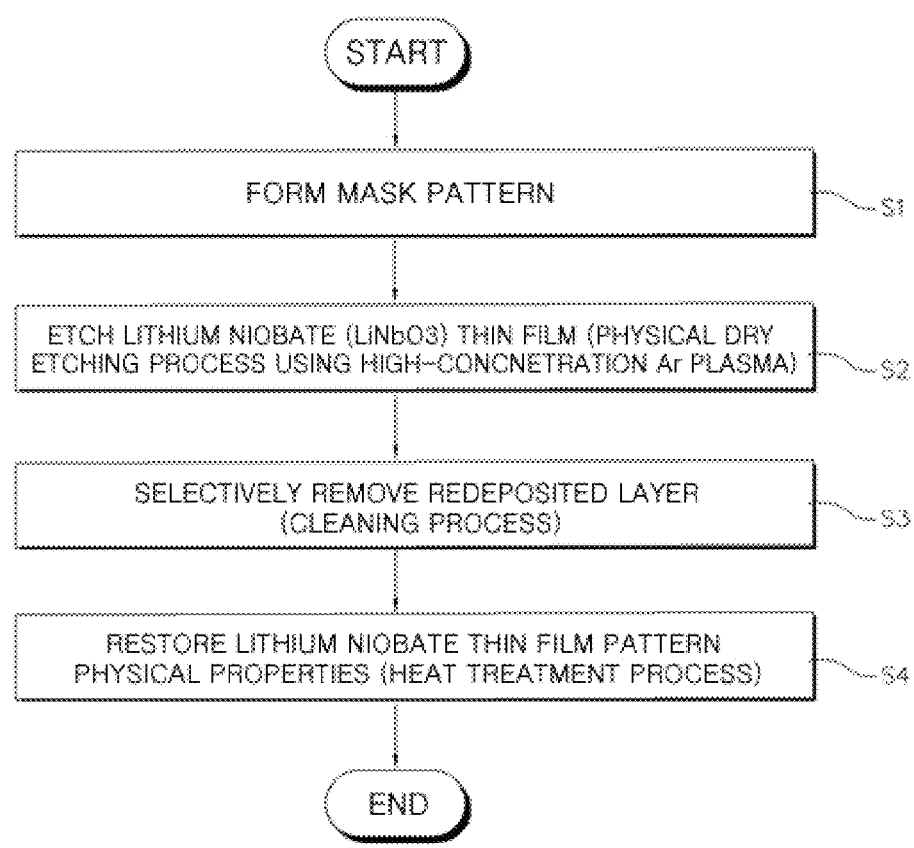
FIG. 1 illustrates a process flowchart of a method for forming a lithium niobate pattern according to an exemplary embodiment of the present invention.

Hereinafter, the benefits and features of the present application, and the methods of achieving the benefits and features will become apparent with reference to embodiments to be described below in detail along with the accompanying drawings. However, the present invention is not limited to the embodiments to be disclosed below and is implemented in various other forms, and the embodiments are only provided for fully representing the scope of the invention to a person with ordinary skill in the technical field to which the present invention pertains, and the present invention will be defined only by the scope of the claims.

Further, in the present specification, throughout the specification, like reference numerals indicate like constituent elements. Moreover, the "and/or" includes each and all combinations of one or more of the items mentioned. The singular form includes the plural forms unless specifically stated in a phrase. For instance, the terms 'comprises' and/or 'comprising' used in the specification do not exclude the presence or addition of one or more other constituent elements in addition to the mentioned constituent elements. In addition, although layers and films (thin films) are described interchangeably, they may be interpreted as the same concept.

Hereinafter, technical features of the present invention will be specifically described with reference to the accompanying drawings.

FIG. 1 illustrates a process flowchart of a method for forming a lithium niobate pattern according to an exemplary embodiment of the present invention.

Referring to FIG. 1, the method for forming a lithium niobate pattern according to an exemplary embodiment of the present invention includes a process of forming a mask pattern (S1), a process of etching lithium niobate (S2), a process of selectively removing a redeposited layer redeposited on a thin film pattern during the etching process (S3), and a restoration process of restoring the physical properties of lithium niobate (S4).

Process of Forming Mask Pattern (S1)

Figure 2:
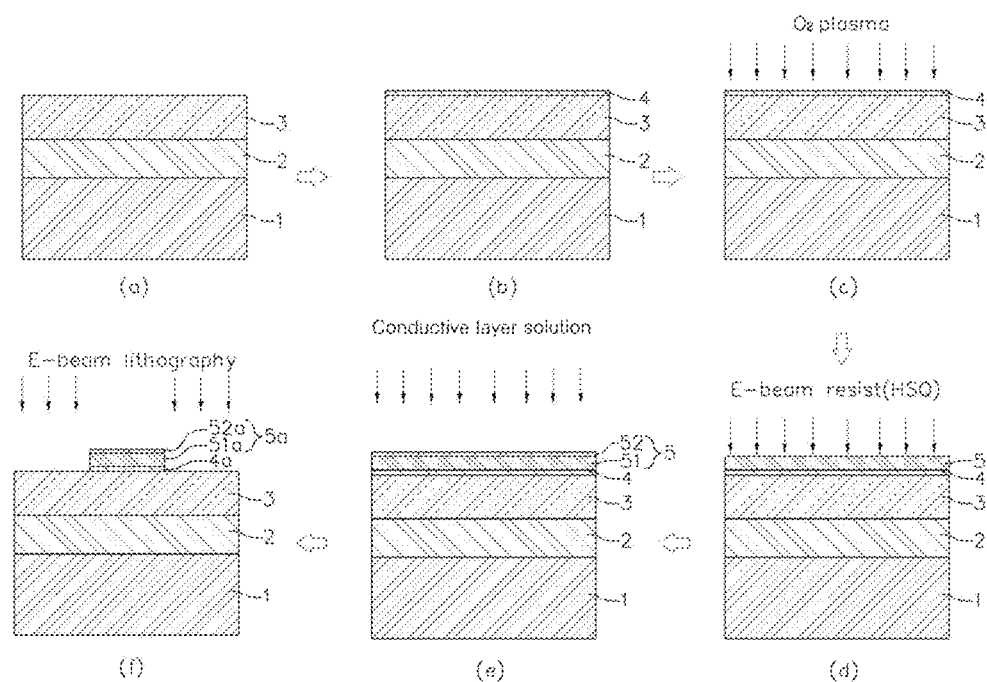
FIG. 2 illustrates a flowchart of a process of forming a mask pattern according to an exemplary embodiment of the present invention.

FIG. 2 illustrates a flowchart of a process of forming a mask pattern according to an exemplary embodiment of the present invention.

As in (a) of FIG. 2, a lithium niobate wafer in which a substrate 1, a silicon dioxide film ($SiO_2$) 2 and lithium niobate ($LiNbO_3$) 3 are stacked is prepared. In this case, the substrate 1 may be a silicon substrate, a lithium niobate substrate or a sapphire substrate. Furthermore, in the case of FIG. 2, the silicon dioxide film 2 is formed as a structure formed under the lithium niobate 3, but the structure is not limited to the silicon dioxide film 2, and the structure below the lithium niobate 3 and formed between the substrate 1 and the lithium niobate 3 may include an insulating film and/or a metal film and the like of various materials other than the silicon dioxide film 2.

Subsequently, as illustrated in (b) of FIG. 2, an adhesive film 4 may be formed for adhesion between a mask 5 formed through a subsequent process and the lithium niobate 3. In this case, as the adhesive film 4, for example, a silicon dioxide film may be deposited to a thickness of about 5 nm to about 15 nm, preferably about nm using plasma-enhanced chemical vapor deposition (PECVD).

An etching method using Ar plasma applied to the method for forming a lithium niobate pattern according to an exemplary embodiment of the present invention is a physical dry etching method that etches an object to be etched through ion bombardment, and requires a relatively hard and thick mask pattern. Accordingly, in an exemplary embodiment of the present invention, hydrogen silsesquioxane (HSQ) is used as the mask 5.

HSQ is a compound composed of $H_8Si_8O_{12}$, which is present in a liquid state in a methyl isobutyl ketone (MIBK) solvent, and can be formed to a thickness of about 1 μm by a spin coating method. Further, when HSQ receives high energy by an electron beam (E-beam) or temperature, bonds between Si—H and O—H are broken, so that HSQ is modified into hard silicon dioxide, and thus may be used as an electron beam resist material.

When a general polymer-based material is used as a mask in a physical etching process using Ar plasma, there is a problem in that the selectivity between the etching rate of the mask and the etching rate of lithium niobate is not very good. Therefore, a physical etching method using Ar plasma requires a mask made of a metal-based mask or a thick silicon dioxide film.

However, although general metal (Cr, Al, Ni)-based masks have high selectivity, they require many additional processes for metal patterning, and the roughness of the pattern and the etched surface is not good. Moreover, although a mask made of a silicon dioxide film may form a smoother pattern than a metal-based mask, the selectivity ratio between the silicon dioxide film mask and lithium niobate is about 0.5, and there is a problem in that a process for patterning a thick silicon dioxide film is added because the silicon dioxide film needs to be formed at least twice compared to the lithium niobate to be etched.

Meanwhile, lithium niobate 3 is known to have poor adhesion to an HSQ solution. For this reason, when an HSQ resist is coated by a spin coating method by directly applying the HSQ solution to the surface of the lithium niobate 3, there may be a problem in that the HSQ solution is not uniformly coated. Therefore, in an exemplary embodiment of the present invention, as illustrated in (b) of FIG. 2, adhesion to the HSQ resist is improved by forming an adhesive film 4 made of silicon dioxide to a certain thickness on the surface of lithium niobate 3 using a PECVD method.

Subsequently, as illustrated in (c) FIG. 2, in an exemplary embodiment of the present invention, the surface of the adhesive film 4 may be surface-treated using 02 plasma in order to increase the adhesion of the mask 5 to be formed a through subsequent process.

Subsequently, as illustrated in (d) and (e) of FIG. 2, in an exemplary embodiment of the present invention, a mask 5 is formed on an adhesive film 4. In this case, the mask 5 may consist of a stacked structure of an HSQ resist film 51 and a conductive layer film 52. In addition, in an exemplary embodiment of the present invention, the mask 5 may also consist of a single layer of the HSQ resist film 51.

A process of forming the mask 5 according to an exemplary embodiment of the present invention may be as follows. For example, an HSQ solution (for example, FOx-25 Dow Corning) is introduced onto an adhesive film 4, and then spin-coated at approximately 1,500 rpm to 2,500 rpm, preferably about 2,000 rpm, and the resultant is heated on a hot plate at approximately 80° C. to 200° C. for 60 seconds to 150 seconds, preferably at about 100° C. for about 90 seconds to form an HSQ resist film 51. Moreover, a conductive layer solution (for example, E-spacer z300) is spin-coated on the surface of the HSQ resist film 51 at approximately 1500 rpm to 2500 rpm, preferably about 2000 rpm to form a conductive layer thin film 52 on the surface of the HSQ resist film 51.

In general, the electrical conductivity between a lithium niobate wafer and an HSQ coated surface is poor due to material properties. For this reason, the pattern may be distorted due to an electron charging phenomenon during an E-beam lithography process, and a conductive layer thin film 52 is formed on the HSQ resist film 51 as illustrated in (e) of FIG. 2 in order to prevent the distortion.

Subsequently, as illustrated in (f) of FIG. 2, a mask pattern 5a is formed on the top of the adhesive film 4 by an E-beam lithography process. In this case, an HSQ resist film pattern 51a and a conductive layer thin film pattern 52a are formed. In this case, the conductive layer thin film pattern 52a may be removed by the E-beam lithography process.

The E-beam lithography process according to an exemplary embodiment of the present invention may be as follows. For example, patterning is performed at a dose of approximately 1,000 uC/cm$^2$ to 2,000 uC/cm$^2$, preferably about 1,400 uC/cm$^2$ using a JBX-9300JEOL apparatus with an acceleration voltage of about 100 kV and a beam current of about 100 pA, or about 0.1 nA to 10 nA. Moreover, the HSQ resist film pattern 51a and the conductive layer thin film pattern 52a are developed for approximately 2 minutes to 5 minutes, preferably about 3 minutes using, for example, AZ 300MIF as a developer solution, and the developer solution was washed off using a mixed solution of isopropyl alcohol (IPA) and deionized water (DI water) to form a mask pattern 5a.

The conditions of the HSQ resist formation process and the electron beam lithography process for forming the mask pattern 5a may be changed according to the thickness and area of the mask pattern 5a to be formed.

Figure 3:
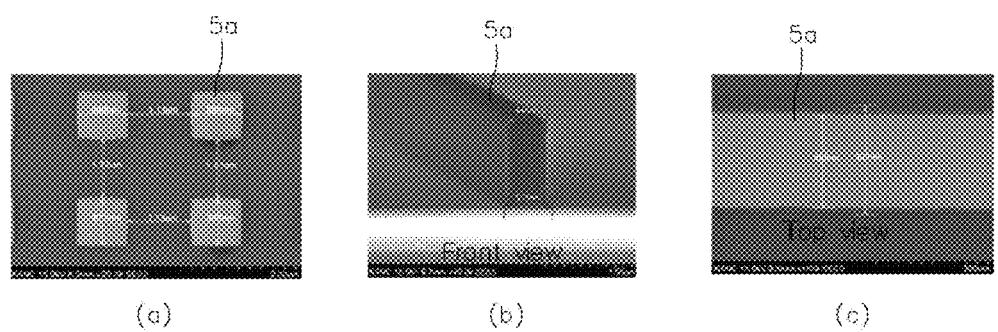
FIG. 3 illustrates a set of scanning electron microscopic (SEM) images of an HSQ mask pattern formed by a process of forming a mask pattern according to an exemplary embodiment of the present invention.

FIG. 3 illustrates a set of scanning electron microscopic (SEM) images of an HSQ mask pattern formed by a process of forming a mask pattern according to an exemplary embodiment of the present invention. Specifically, FIG. 3 is a set of views of the HSQ mask pattern formed through the mask pattern forming process illustrated in FIG. 2, taken by a scanning electron microscope (SEM), and as illustrated in FIG. 3, it can be confirmed that the pattern and etched surface of the HSQ mask pattern 5a are more smoothly formed.

Figure 4:
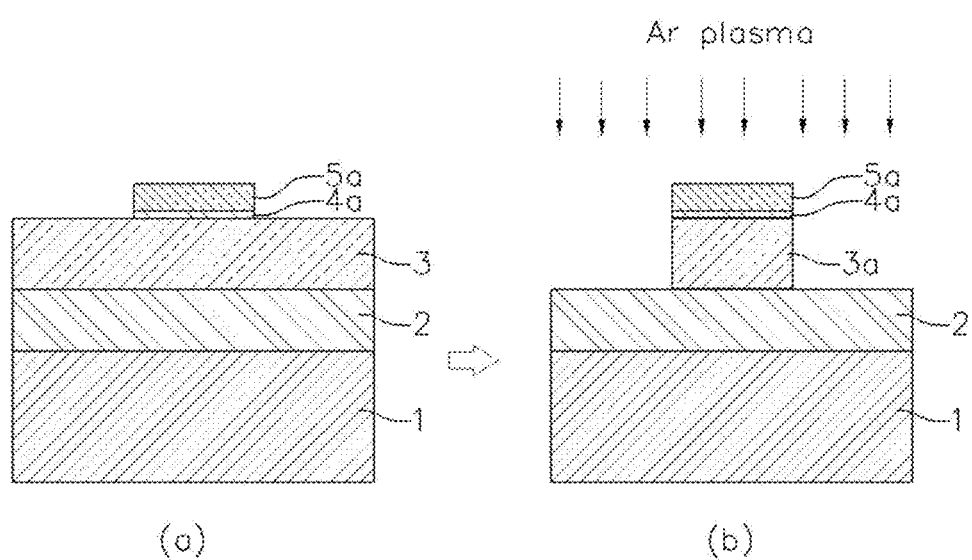
FIG. 4 illustrates a process of etching lithium niobate using physical dry etching using Ar plasma according to an exemplary embodiment of the present invention.

Process of etching lithium niobate (S2) FIG. 4 illustrates a process of etching lithium niobate using physical dry etching using Ar plasma according to an exemplary embodiment of the present invention.

Referring to (a) and (b) of FIG. 4, physical dry etching is performed on the entire surface of the lithium niobate wafer using the mask pattern 5a formed in (f) of FIG. 2 as an etching mask to etch lithium niobate 3 which is not covered by the mask pattern 5a and is exposed.

The process of etching lithium niobate 3 according to an exemplary embodiment of the present invention is performed by a physical dry etching method using high-concentration Ar plasma increased by injecting Ar gas into a chamber. That is, lithium niobate is etched by performing a physical dry etching method which forms a high-concentration Ar plasma state with an increased Ar ionization rate by forming an electron transfer loop through an electric field or a magnetic field in a chamber, and uses the thus increased high-concentration Ar plasma.

Moreover, in the etching process of lithium niobate 3 according to an exemplary embodiment of the present invention, a high-concentration Ar plasma is formed in a high vacuum state by allowing high kinetic energy to be obtained even at a low bias voltage during the etching process. Furthermore, according to an exemplary embodiment of the present invention, the process pressure of the chamber may be lowered to maintain a low gas density in the chamber. This is to reduce the number of collisions of accelerated ions with atoms in the chamber. That is, a mean free path for free acceleration is increased, and as a result, high kinetic energy may be obtained even at a low bias voltage. Here, the Ar ionization rate refers to the ratio of ionized Ar to Ar gas introduced into a process chamber.

Figure 5:
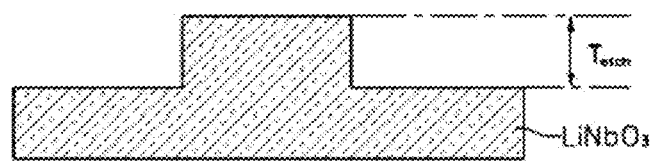
FIG. 5 illustrates the etching rate of lithium niobate according to the process pressure of a chamber according to an exemplary embodiment of the present invention and estimated values of the etching rate according to process pressure.
Figure 5:
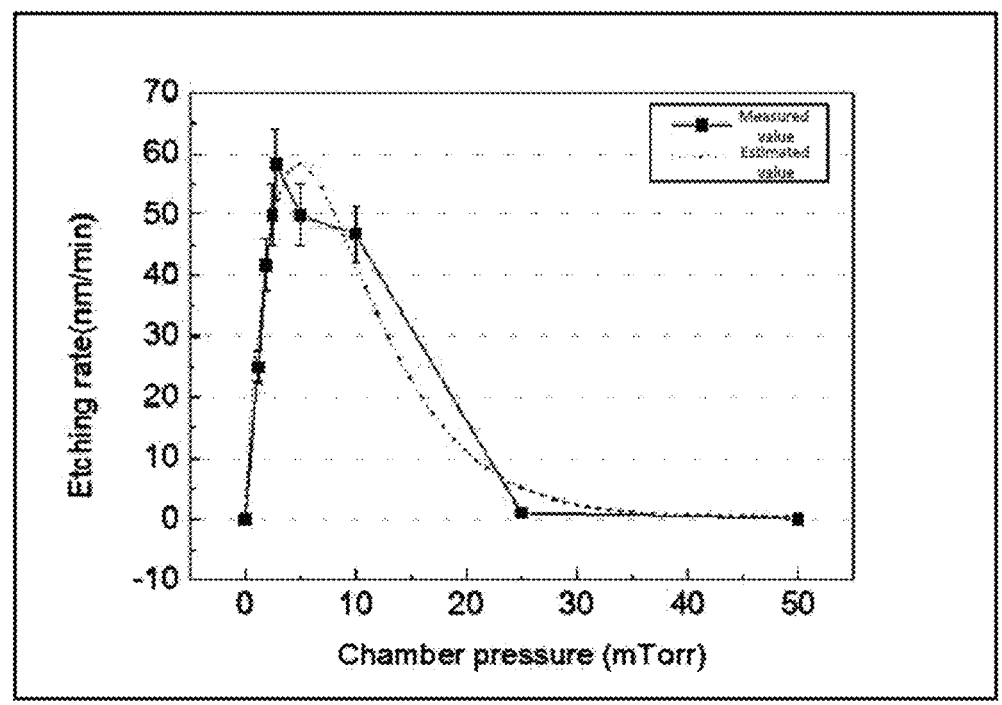
Figure 6:
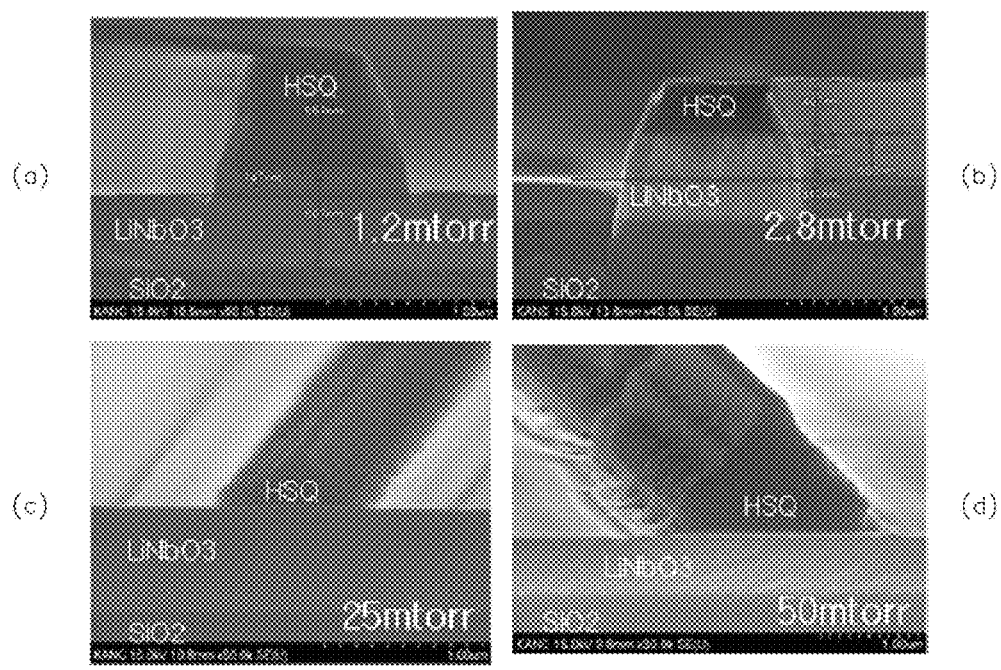
FIG. 6 illustrates a set of SEM images of results of etching lithium niobate at each process pressure of a chamber according to an exemplary embodiment of the present invention.

FIG. 5 illustrates the etching rate of lithium niobate according to the process pressure of a chamber according to an exemplary embodiment of the present invention and estimated values of the etching rate according to process pressure. Furthermore, FIG. 6 illustrates a set of SEM images of results of etching lithium niobate at each process pressure (1.2/2.8/25/50 mTorr) of a chamber according to an exemplary embodiment of the present invention. Specifically, the exemplary embodiments according to FIGS. 5 and 6 are the results of testing the etching rate of lithium niobate under conditions of an inductively coupled plasma (ICP) power of 300 W of Ar plasma and a bias power of 200 W while changing the process pressure of the chamber from 1.2 mTorr to 50 mTorr. As a result of the test, it was confirmed that the optimum etching rate was shown at about 5 mTorr, and etching was hardly performed at 25 mTorr or more. Based on the resulting values, an estimated value of the etching rate was calculated as illustrated in FIG. 5, and specifically, the estimated etching rate value according to pressure under the same bias environment may be obtained by simplifying into $A*Pe^{-B*P}$ (P: pressure, A, B: constant) based on the process gas amount and Saha ionization equation for modeling, and comparing and analyzing the modeling values with the measurement results.

It could be confirmed that when the process pressure in the chamber was 25 mTorr or more, ions could not be accelerated with sufficient energy to etch lithium niobate due to high gas density in the chamber and a low ionization rate, and as a result, the lithium niobate was hardly etched and only the HSQ mask was damaged (see (c) and (d) of FIG. 6). When the process pressure drops below 25 mTorr, the density in the chamber decreases, which accelerates Ar ions with higher and higher energy to bombard the surface, thereby increasing the etching rate. Moreover, it could be confirmed that when the process pressure is decreased to about 2 mTorr to 3 mTorr, the etching rate tended to decrease again because the amount of decrease in Ar ions themselves was greater than the amount of increase in the acceleration energy of Ar ions. Therefore, in the process of etching lithium niobate of the method for etching lithium niobate according to the present invention, the process pressure of the chamber may be maintained at 1 mTorr to 20 mTorr. Further, in an exemplary embodiment of the present invention, in the process of etching lithium niobate, the process pressure of the chamber may be 1 mTorr to 15 mTorr, 2 mTorr to mTorr, 2.5 mTorr to 10 mTorr, or 2.5 mTorr to 7.5 mTorr. When the process pressure of the chamber is 1 mTorr to 20 mTorr, the present invention has an etching rate of 10 nm/min or more through estimation by fitting according to FIG. 5, and may effectively etch lithium niobate.

Figure 7:
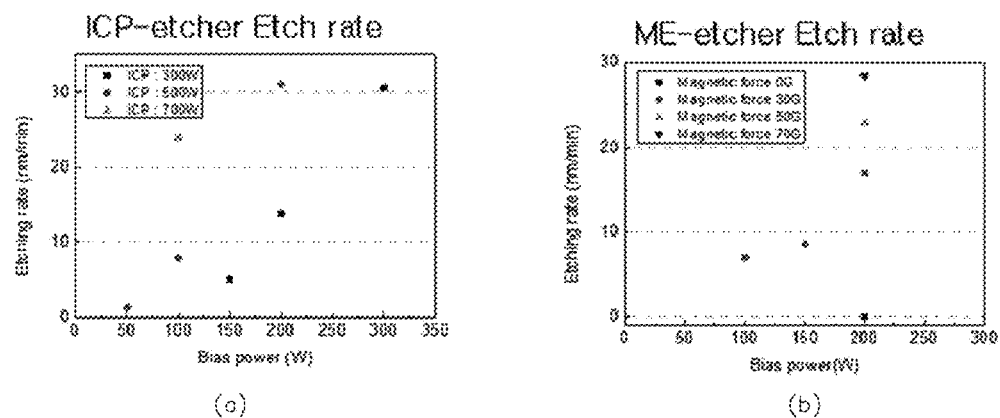
FIG. 7 illustrates the etching rate of lithium niobate according to the change in concentration of Ar plasma and the change in bias voltage according to an exemplary embodiment of the present invention.

FIG. 7 illustrates the etching rate of lithium niobate according to the change in concentration of Ar plasma and the change in bias voltage according to an exemplary embodiment of the present invention. Specifically, in FIG. 7, (a) shows the etching rate in ICP etching equipment, and (b) shows the etching rate in ME etching equipment.

In (a) of FIG. 7, in order to confirm the change in etching according to the change in concentration of Ar plasma based on the ICP etching equipment, changes in the etching rate of lithium niobate were compared based on the lithium niobate etching rate obtained through changes in ICP power and bias power applied to an induced coupling coil. When the ICP etching equipment is used, AC power, that is, ICP power, applied to the induced coupling coil located around the upper periphery of the chamber generates resonant electrons. For this reason, as the ICP power increases, the ionization rate of the Ar plasma increases, and the increase in the ionization rate of the Ar plasma increases the concentration of the Ar plasma.

As illustrated in (a) of FIG. 7, the rate of change in the etching rate of lithium niobate was confirmed while changing the ICP power from 300 W to 700 W and the bias power from 50 W to 300 W at an Ar flow rate of 40 sccm and a process pressure of 7 mTorr of Ar plasma. At an ICP power of 700 W, an appropriate etching rate of about 25 nm/min was confirmed even at a bias power of about 100 W. Conversely, it was confirmed that, at an ICP power level of 300 W, a bias power of 300 W is required to obtain an etching rate of approximately 31 nm/min similar to that obtained at an ICP power level of 700 W.

In (b) of FIG. 7, in order to confirm the change in etching according to the change in concentration of the Ar plasma based on magnetron plasma etching equipment, specifically ME etching equipment, changes in etching rate of lithium niobate were compared through changes in magnetic force and bias power in the chamber. When the magnetron plasma etching equipment is used, an electromagnet appropriately disposed around the chamber can create a loop of rotating electrons, so that the change in electromagnetic intensity changes the ionization rate (concentration of plasma) of the Ar plasma.

As illustrated in (b) of FIG. 7, the etching rate was confirmed at an electromagnetic intensity of 0 Gauss to 70 Gauss and a bias power of 100 W to 200 W at a process atmosphere of 5 mTorr performed under the condition of a 10 sccm Ar flow rate of the Ar plasma. When the electromagnetic intensity was changed from 0 G to 70 G at the same bias power of 200 W and the etching rate was confirmed, a higher etching rate was observed when the concentration of Ar plasma was increased by increasing the electromagnetic intensity. Further, it can be confirmed that under the same electromagnetic intensity condition of 30 Gauss, the higher the bias power applied, the higher the etching rate.

Based on the results according to FIG. 7, during the etching process of lithium niobate 3, in the case of the etching equipment used in an exemplary embodiment of the present invention, the process pressure may be controlled to 1 mTorr to 20 mTorr by adjusting an Ar flow rate and the angle of a throttle valve. Furthermore, at the selected process pressure, plasma concentration and bias power may be applied complementarily in order to increase the bombardment energy of Ar plasma ions. However, since excessive energy accumulates damage to lithium niobate and too little energy hinders etching and worsens mask selectivity, an appropriate balance is required. That is, in the case of the ICP etching equipment process conditions used in an exemplary embodiment of the present invention, when the ICP power is adjusted to 300 W to 1000 W, specifically 300 W to 700 W, optimal etching conditions may be set by selecting a suitable bias power from 50 W to 300 W. Further, in the case of the magnetron plasma etching equipment process conditions, when the electromagnetic intensity is selected from 10 Gauss to 70 Gauss, optimal etching conditions may be set by selecting a suitable bias power from 50 W to 300 W, specifically, from 100 W to 250 W, or 100 W to 200 W.

Process of Removing Redeposited Layer (S3)

As illustrated in FIG. 1, a lithium niobate pattern 3a is formed by etching lithium niobate 3, and then a redeposited layer in which impurities generated during the etching process of lithium niobate 3 are redeposited on a pattern 3a of lithium niobate may be selectively removed by a cleaning process (S3).

The physical etching process for etching lithium niobate 3 may cause redeposition of generated by-products after etching. A redeposited layer that is present after etching needs to be removed by a cleaning process because the redeposited layer greatly affects optical loss in, for instance, an optical waveguide application device.

In the existing cleaning process, a method of cleaning the surface by regular cleaning process methods of the CMOS process such as sulfuric acid peroxide mixture (SPM) and ammonia and hydrogen peroxide mixture (APM) cleaning has been utilized. An example of an APM cleaning process was proposed in "Optical Materials, 53, 1-5., https://doi.org/10.1016/j.optmat.2015.12.040, APM cleaning". The APM cleaning process is performed three times at 85° C. for one hour each by mixing ammonia water, hydrogen peroxide, and distilled water at a ratio of 2:2:1. However, when the reaction of ammonia water and hydrogen peroxide is completed, there is a disadvantage in that the solution needs to be replaced, which takes a long time of more than 3 hours, and cleaning time is irregular and long due to the method of removing the deposited material by forming bubbles generated by the chemical reaction of the mixed solution and the bubbles dropping near the redeposited material on the side wall.

Figure 8:
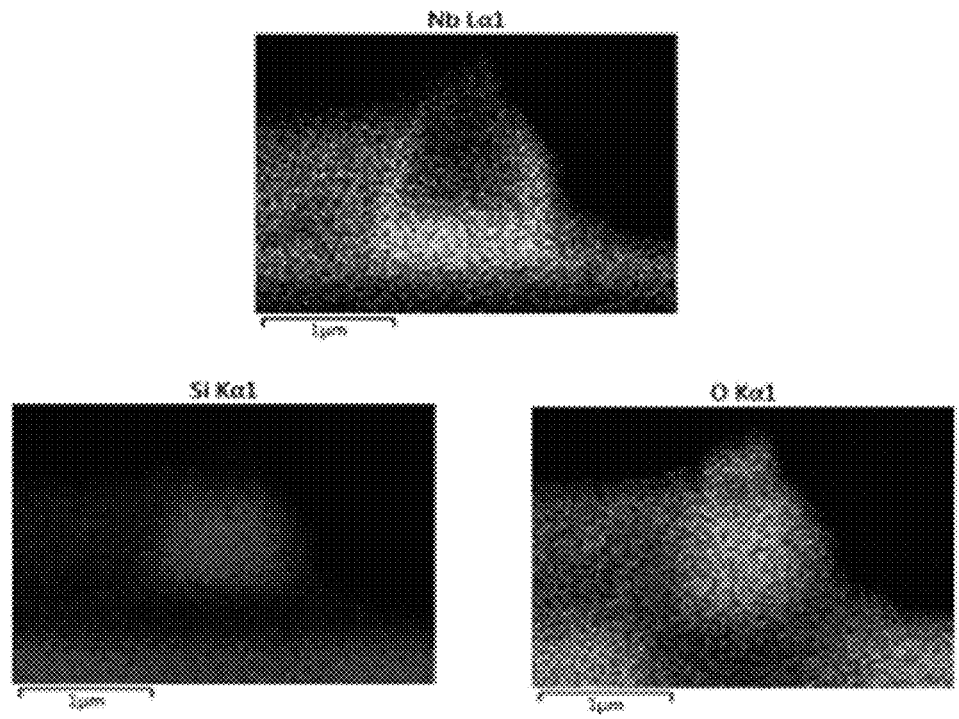
FIG. 8 illustrates a set of images analyzed by energy dispersive X-ray spectroscopy (EDS) in order to analyze components of a redeposited layer after etching lithium niobate according to an exemplary embodiment of the present invention.

FIG. 8 illustrates a set of images analyzed by energy dispersive X-ray spectroscopy (EDS) in order to analyze components of a redeposited layer after etching lithium niobate according to an exemplary embodiment of the present invention.

As illustrated in FIG. 8, after the process of etching lithium niobate 3, the main component of the redeposited layer may be estimated to be Nb powder from the results of energy dispersive X-ray spectroscopy (EDS) analysis. Since the Nb powder component is easily dissolved in an alkaline (Na, K)-based aqueous solution and the lithium niobate 3 has a very low solubility, the redeposited layer may be selectively removed.

A KOH aqueous solution may be used in the cleaning process according to an exemplary embodiment of the present invention. For example, after 200 ml of a 45% KOH aqueous solution is prepared in a fluororesin beaker, the temperature of the KOH aqueous solution is heated to 80° C. on a hot plate. Thereafter, the lithium niobate is put into a cleaning tray and completely immersed in the solution, and then maintained for 20 minutes, and after cleaning is completed, the lithium niobate is washed with DI water for 5 minutes. In addition, the HSQ mask pattern 5a may also be removed through the cleaning process. Therefore, the cleaning process according to the present invention may be performed after removing the HSQ mask pattern 5a or may be performed without removing the HSQ mask pattern 5a.

Figure 9:
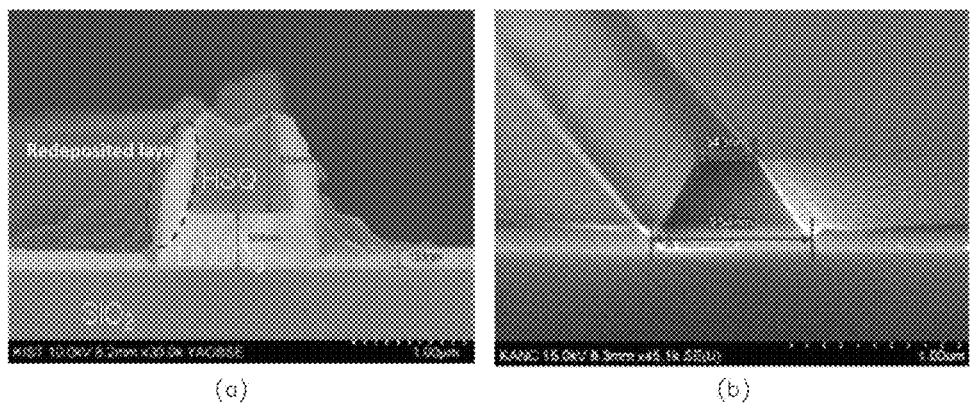
FIG. 9 illustrates a set of images of a lithium niobate pattern before and after a cleaning process according to an exemplary embodiment of the present invention.
Figure 10:
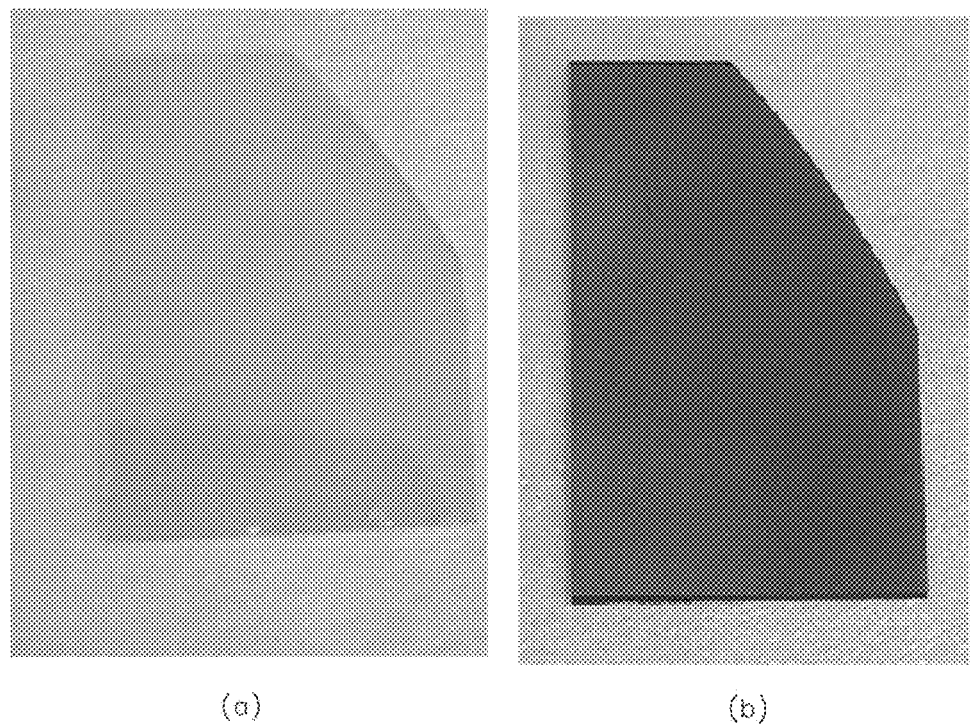
FIG. 10 is a set of images of observing the transparency of lithium niobate after an etching process of lithium niobate according to an exemplary embodiment of the present invention.

FIG. 9 illustrates a set of images of a lithium niobate pattern before and after a cleaning process according to an exemplary embodiment of the present invention. As illustrated in (a) of FIG. 9, it can be confirmed that a redeposited layer is present on the sidewalls of the lithium niobate pattern and the HSQ mask pattern before cleaning, but as illustrated in (b) of FIG. 9, it can be confirmed that the redeposited layer is completely removed after the cleaning process.

Process of Restoring Transparency of Lithium Niobate (S4)

A transparent lithium niobate material may turn black as illustrated in FIG. when excess energy is excited in the lithium niobate material during etching or reactive impurities enter the chamber. This is because light in the visible region is absorbed by the vacancies of Li atoms in the case where light Li atoms easily diffuse and escape when high energy is excited in the lithium niobate material (when $LiNbO_3$ is irradiated with strong X-rays for a long time, electron and hole trapping occurs in Nb4+ and Li vacancies, so that light with a visible light (1.58 to 3.26 eV) wavelength is absorbed, see "Journal of Physics C: Solid State Physics, Volume 17, Number 3 (1984))". As such, as a factor which limits the application of optical devices, the change in color of the lithium niobate material is one of the problems that must be solved.

As a result of conducting an experiment using the method for etching lithium niobate or the method for forming a lithium niobate pattern according to the present invention, it was confirmed that the transparency of the sample is changed depending on the etching conditions. In particular, a sample obtained by etching lithium niobate with high energy turned black. As a result of analysis through X-ray photoelectron spectroscopy (XPS), the absence of Li atoms on the surface was confirmed due to damage concentrated on the surface of the sample.

In the process of restoring the transparency of lithium niobate according to an exemplary embodiment of the present invention, through heat treatment (annealing process) at an appropriate temperature, the damage concentrated on the surface may be dispersed by vacancies of Li atoms and the atomic arrangement and ratio may be restored.

In order to confirm the effect of the heat treatment, a blackened sample was prepared by etching with excess energy.

Figure 11:
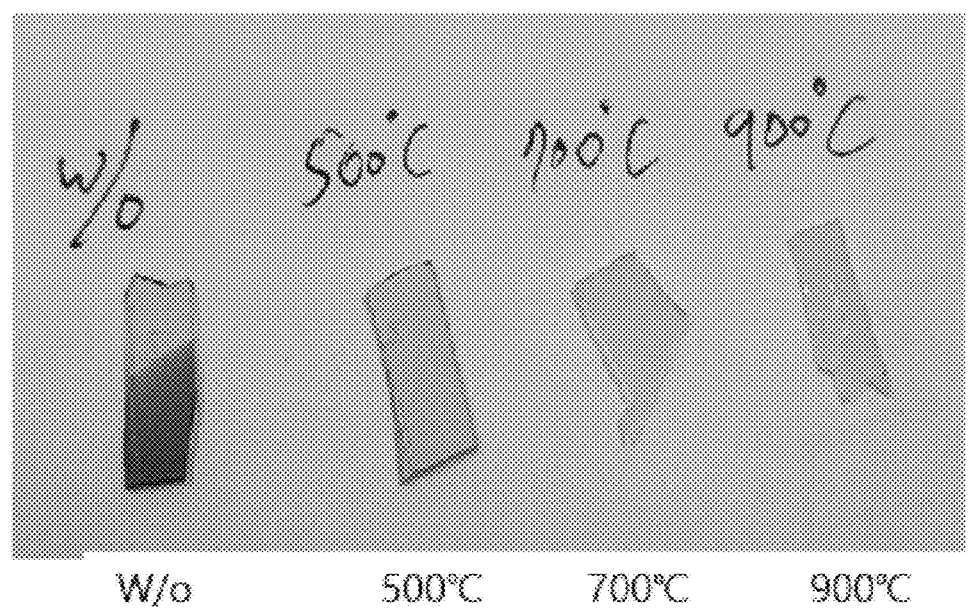
FIG. 11 is an image of observing the change in transparency of lithium niobate according to the heat treatment temperature according to an exemplary embodiment of the present invention.

Under each heat treatment temperature condition, the heat treatment (annealing process) is performed at a temperature of 500° C., 700° C., and 900° C., respectively. In this case, the gas environment was an $O_2$ flow environment, the rate of increase in temperature was 5° C./min, and cooling was performed by natural cooling at room temperature. As illustrated in FIG. 11, it was confirmed that when the sample was observed with the naked eye after the heat treatment, the sample that had turned black became transparent again after the heat treatment.

Figure 12:
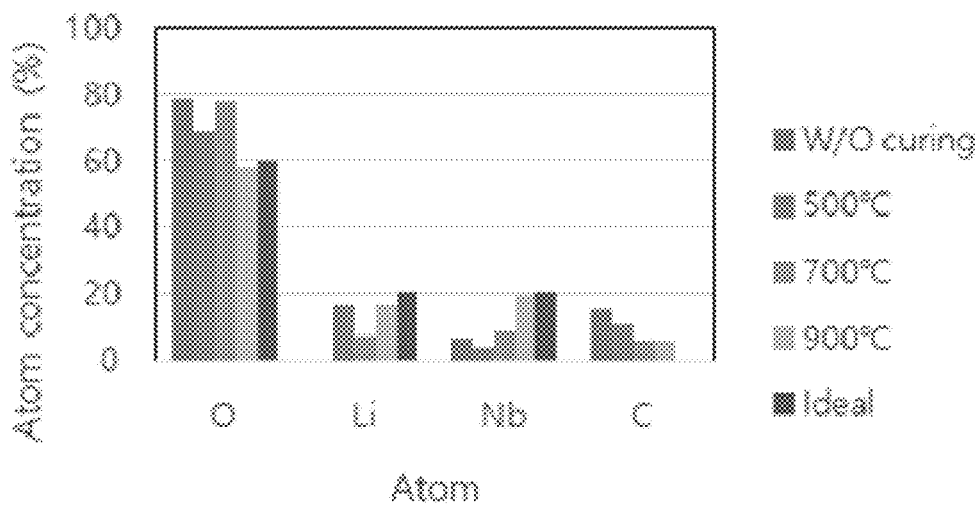
FIG. 12 illustrates changes in the composition ratio of atoms on the surface of lithium niobate according to the heat treatment temperature according to an exemplary embodiment of the present invention.

In addition, the atomic composition ratio of the sample surface was investigated through X-ray photoelectron spectroscopy (XPS). As shown in the following Table 1 and FIG. 12, it was confirmed that, after etching lithium niobate, the absence of Li atoms on the surface of lithium niobate was improved by restoring Li atoms to a certain level after the heat treatment.

TABLE 1

| O1s | Li1s | Nb3d | C1s |
|---|---|---|---|
| W/O Annealing | | | |
| 78.7441 | 0 | 6.26819 | 14.9877 |
| 500° C. Annealing | | | |
| 68.1859 | 16.7577 | 3.90915 | 11.1473 |
| 700° C. Annealing | | | |
| 78.0585 | 7.25051 | 8.64062 | 6.05035 |
| 900° C. Annealing | | | |
| 57.8643 | 16.7357 | 19.509 | 5.89097 |

Therefore, in the process (S4) of restoring the transparency of lithium niobate (or the lithium niobate pattern) according to an exemplary embodiment of the present invention, after etching the lithium niobate, the pattern physical properties (color) of the lithium niobate may be restored by performing a heat treatment process at a temperature of 500° C. to 900° C. in an $O_2$ flow gas environment.

Meanwhile, in the Ar etching technique applied in the process of etching lithium niobate according to an exemplary embodiment of the present invention, the conditions in the initial chamber are very important. The presence of gas components from impurities present in the chamber and residual gases incorporated in the atmosphere may have a great impact on the etching rate and the morphology of the pattern by changing the energy and direction of ions accelerated by the physical dry etching method, which causes high-energy collision reactions. For this reason, prior to etching lithium niobate, the impurities present in the chamber must be preferentially removed through the conditioning and high vacuum ($<10^{-6}$ Torr) pumping of the initial chamber. Therefore, in order to maintain process reproducibility, it is important to maintain a sufficient vacuum, such that the initial pump pressure is $10^{-6}$ Torr or less not only for sufficient chamber cleaning, but also for a pure Ar gas composition.

When the performance of the vacuum pump is limited due to structural defects of the process equipment or insufficient performance of the vacuum pump, it is difficult to maintain the initial pure Ar composition in the chamber, making it difficult to secure the reproducibility of the process. Therefore, in an exemplary embodiment of the present invention, the reproducibility of the process within a limited vacuum pump environment was secured by applying a multiple Ar purge process technique in order to overcome such difficulties. For example, in the case of ICP-RIE (AFS-IR6T, All For System) equipment, continuous operation for 6 hours or more was required for high vacuum ($<10^{-6}$ Torr) pumping.

A multiple Ar purge process for chamber stabilization according to an exemplary embodiment of the present invention is as follows. For example, a sample is input and a vacuum pump is operated for 20 minutes to reach a level possible under atmospheric pressure conditions. Thereafter, the operation of the vacuum pump is stopped and Ar gas is injected until the internal pressure of the chamber reaches 100 Torr. Thereafter, the injection of Ar gas is stopped, and then the vacuum pump is operated again for 10 minutes. Thereafter, the injection of Ar gas and the pumping of the vacuum pump are performed repeatedly three times or more. Thereafter, Ar gas is injected up to the process pressure, and then an etching process is performed in the same manner.

Figure 13:
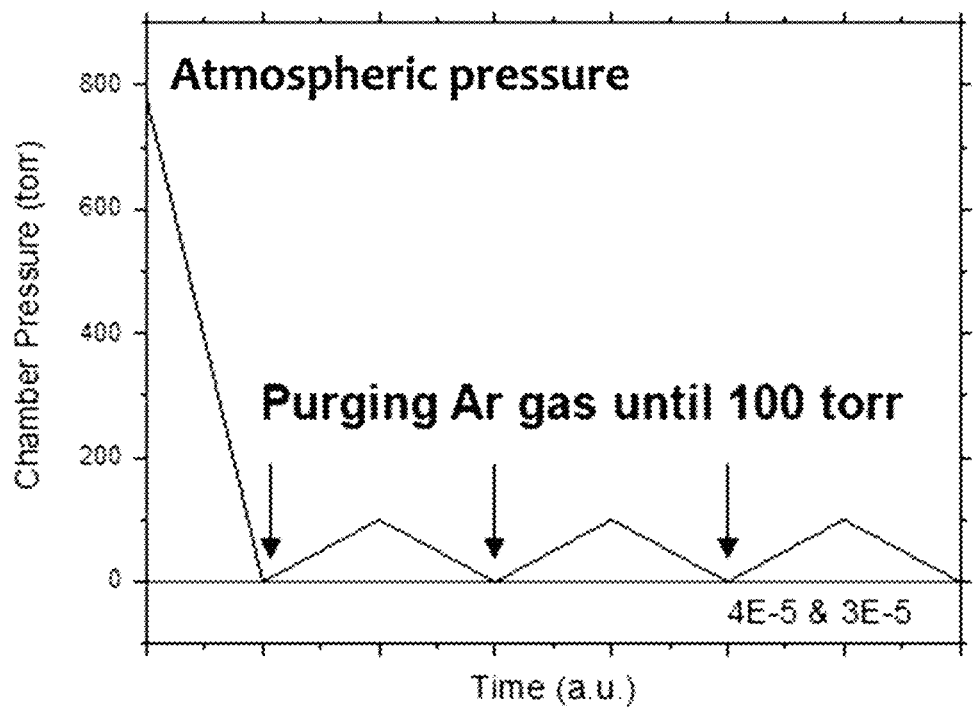
FIG. 13 illustrates changes in the internal pressure of a chamber according to the injection of Ar during an Ar purge process according to an exemplary embodiment of the present invention.
Figure 14:
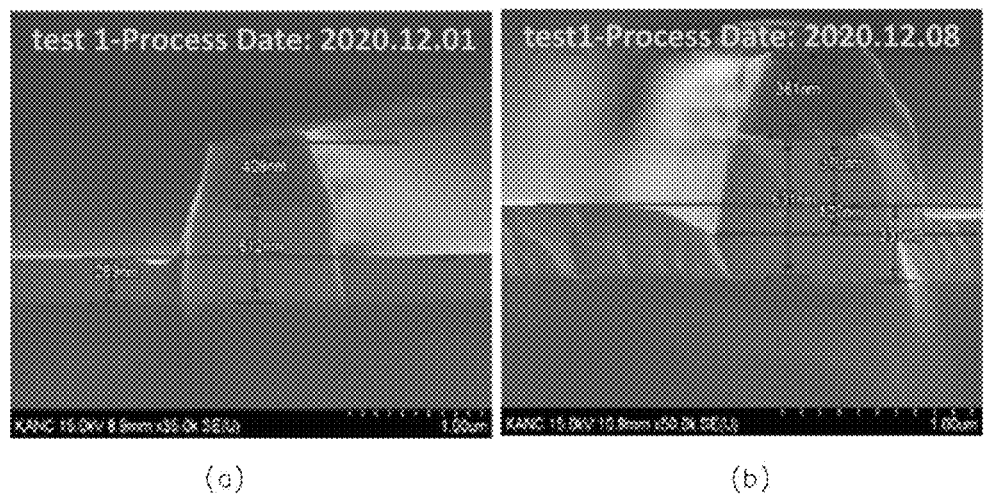
FIG. 14 is a set of SEM images comparing process reproducibility after a multiple Ar purge process according to an exemplary embodiment of the present invention.

FIG. 13 illustrates changes in the internal pressure of a chamber according to the injection of Ar during an Ar purge process according to an exemplary embodiment of the present invention, and FIG. 14 is a set of SEM images comparing process reproducibility after a multiple Ar purge process according to an exemplary embodiment of the present invention.

As illustrated in FIG. 13, when multiple Ar injection is performed, the proportion of Ar gas is significantly higher than that of other gases when considering the proportion of residual gases in the chamber. When the multiple Ar injection is performed by a simple pumping method for the initial pure Ar gas composition, the pumping must be performed for a long time (approximately 6 hours or more) to maintain the vacuum, but the pumping may be reduced to less than 1 hour through multiple Ar purges. Furthermore, as illustrated in FIG. 14, it can be confirmed that the result (A) of performing the multiple Ar purge process according to an exemplary embodiment of the present invention and etching shows more remarkably improved etching results than the result (B) of etching without performing the multiple Ar purge process. Further, by increasing the proportion of residual Ar gas in the chamber through the multiple Ar purge process according to an exemplary embodiment of the present invention, reproducibility that was difficult to achieve in equipment limited to high vacuum pumping ($>10^{-6}$ Torr) may be secured.

Figure 15:
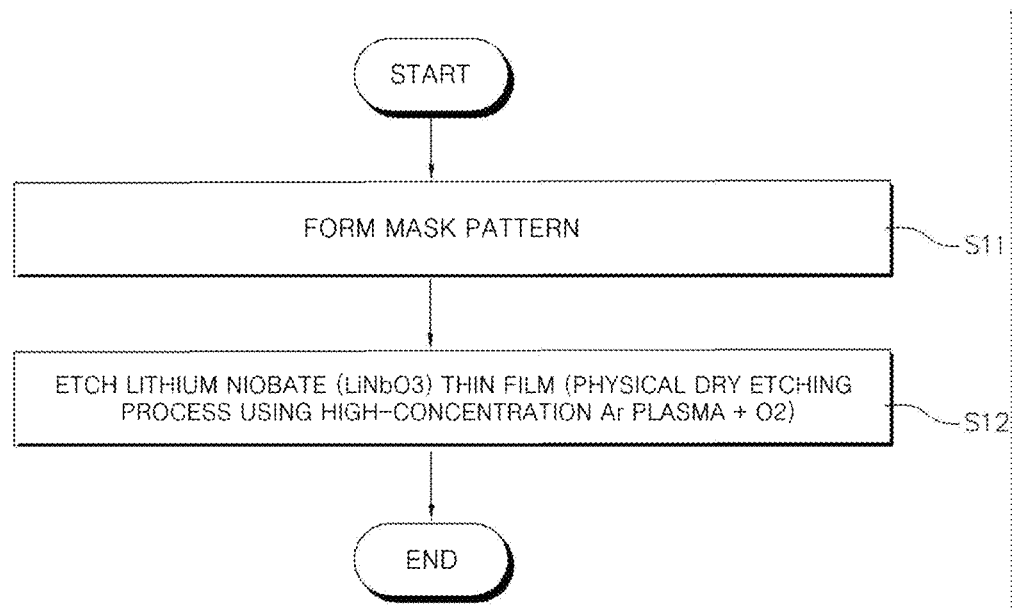
FIG. 15 illustrates a process flowchart of a method for forming a lithium niobate pattern according to another exemplary embodiment of the present invention.

FIG. 15 illustrates a process flowchart of a method for forming a lithium niobate pattern according to other exemplary embodiments of the present invention. Specifically, referring to FIG. 15, the method for forming a lithium niobate pattern according to another exemplary embodiment of the present invention etches lithium niobate using a physical etching process using Ar plasma under a high vacuum mixed with $O_2$ gas, unlike the exemplary embodiment illustrated in FIG. 1.

In the process of etching lithium niobate according to an exemplary embodiment of the present invention, the use of a mixed gas of Ar gas and oxygen gas may help maintain physical properties after etching by removing the redeposited layer and removing a layer due to imperfect materials during the etching. However, when the proportion of oxygen gas is excessively high, the anisotropic etching rate may be increased, and when the proportion of oxygen gas is excessively low, the mixing ratio needs to be adjusted because the above-mentioned effect may be insignificant. Accordingly, in the process of etching lithium niobate according to another exemplary embodiment of the present invention, the volume ratio of Ar gas and $O_2$ gas in the mixed gas may be 1:0.5 to 1:2, specifically 1:0.75 to 1:1.5, and more specifically about 1:1.

In the exemplary embodiment illustrated in FIG. 1, since a cleaning process for removing the redeposited layer after the etching process using an Ar plasma etching technique (S3) and a heat treatment process for restoring physical properties caused by damage (S4) must be additionally performed, the processes are somewhat increased and may be complicated.

However, in another exemplary embodiment of the present invention, the process of removing a redeposited layer and the process of maintaining physical properties may be simultaneously performed using a mixed gas in which Ar and $O_2$ gases are mixed at the aforementioned volume ratio instead of using Ar gas alone during an etching process for etching lithium niobate. The mixing of $O_2$ gas may increase the likelihood that the redeposited Nb powder will combine with highly mobile oxygen ions to be removed from the surface. In addition, vacancies in Li atoms are removed by the reduction reaction of oxygen ions, enabling stable etching without a post-treatment process.

Figure 16:
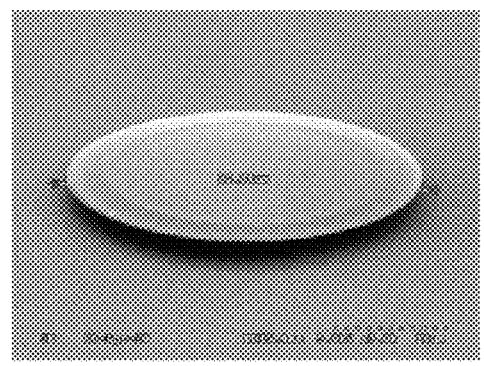
FIG. 16 illustrates a set of SEM images of a disk resonator manufactured by a method for forming a lithium niobate pattern using a mixed gas of Ar gas and $O_2$ gas according to another exemplary embodiment of the present invention.
Figure 16:
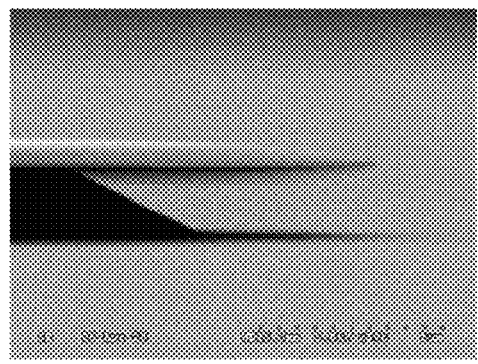

FIG. 16 illustrates a set of SEM images of a disk resonator manufactured by a method for forming a lithium niobate pattern using a mixed gas of Ar gas and $O_2$ gas according to another exemplary embodiment of the present invention. Specifically, FIG. 16 is a set of views obtained by photographing, using an SEM, a disk resonator having a high-quality coefficient manufactured by the above-described method for forming a lithium niobate pattern using a mixed gas in which Ar gas and $O_2$ gas are mixed at a volume ratio of 1:1, and B illustrates an enlarged view of part of A. According to FIG. 16, it can be seen that excellent precision and smooth patterns can be implemented through physical dry etching using a mixed gas in which Ar and $O_2$ gases are mixed. Furthermore, as illustrated in FIG. 16, it could be confirmed that in the disk resonator manufactured by the method for forming a lithium niobate pattern according to an exemplary embodiment of the present invention, a redeposited layer was not present, and the physical properties were also restored.

As illustrated in FIG. 15, the method for forming a lithium niobate pattern according to other exemplary embodiments of the present invention includes a process of forming a mask pattern (S11) and a process of etching a lithium niobate thin film (S12).

The process of forming a mask pattern (S11) may be performed by the method as described above. Specifically, as described above, the process of forming a mask pattern may be performed by the same process as the mask pattern forming process (S1) illustrated in FIGS. 1 and 2. Further, the process of etching a lithium niobate thin film (S12) may be performed within the process pressure range as described above. In addition, the process of etching a lithium niobate thin film (S12) may be performed using the above-described ICP etching equipment and conditions, or magnetron plasma etching equipment and conditions. For example, the process of etching a lithium niobate thin film (S12) according to an exemplary embodiment of the present invention may be performed at a source power (ICP power) of 300 W, a bias power of 500 W, an Ar flow rate of 5 sccm, an O2 flow rate of 5 sccm, and a chamber process pressure of 1.9 mTorr for 55 minutes.

As described above, according to the present invention, the amount of etching byproducts can be remarkably reduced by completely eliminating a chemical reaction caused by reactive compound gases ($SF_6$, $CF_4$, $CHF_3$, $Cl_2$, $BCl_3$, and the like) including halogen elements that produce non-volatile impurities, and accordingly, the angle of the etched sidewall can be uniformly controlled.

Further, according to the present invention, uniform physical etching of large-area lithium niobate can be implemented at a low bias voltage by increasing the density of Ar plasma and decreasing the process pressure.

In addition, according to the present invention, since physical etching is used, there is an advantage in that the problem of chemical etching, in which etch blocking occurs due to etching byproducts, can be solved.

Furthermore, according to the present invention, a hydrogen silsesquioxane (HSQ) resist can be used by replacing a metal-based mask and a silicon dioxide mask, which have been widely used in the related art, as an etching mask for etching lithium niobate to simplify the process compared to the silicon dioxide mask while securing a smooth pattern and a smooth surface compared to the metal-based mask.

Further, according to the present invention, a high-quality lithium niobate pattern can be obtained by performing a cleaning process after a process of etching lithium niobate to remove a redeposited layer formed by byproducts generated during the process of etching lithium niobate.

In addition, according to the present invention, a high-quality lithium niobate pattern can be obtained by performing a heat treatment process (annealing process) after a process of etching lithium niobate to restore changes in physical properties (transparency) of lithium niobate caused by damage applied to a thin film during the process of etching lithium niobate to the original state (restore transparency).

Furthermore, according to the present invention, by a physical dry etching method using a mixed gas of Ar gas and $O_2$ gas, lithium niobate can be etched and simultaneously, a redeposited layer due to etching byproducts can be removed.

Although preferred exemplary embodiments of the present invention have been described and illustrated using specific terms, such terms are only for clarity of the description of the invention. It is obvious that various modifications and changes may be made to the embodiments and the described terms of the present invention without departing from the technical spirit and scope of the following claims. Such modified embodiments should not be understood individually from the spirit and scope of the present invention, but rather should be said to fall within the claims of the present invention.

EXPLANATION OF REFERENCE NUMERALS AND SYMBOLS

1: Substrate
2: Silicon dioxide film
3: Lithium niobate
3a: Pattern of lithium niobate
4: Adhesive film
5: Mask
5a: Mask pattern
51: HSQ resist
52: Conductive layer thin film
51a: HSQ resist pattern
52a: Conductive layer thin film pattern

What is claimed is:

1. A method for etching lithium niobate, the method comprising:
a process of etching lithium niobate using a mask pattern, as a physical dry etching method using Ar plasma produced in a chamber through Ar gas,
wherein in the process of etching lithium niobate, a process pressure of the chamber is maintained at 1 mTorr to 20 mTorr, and
a process of forming a mask pattern on the lithium niobate, wherein the forming of the mask pattern comprises:
a process of forming an adhesive film on the lithium niobate;
a process of spin-coating an HSQ resist on the adhesive film;
a process of forming a conductive layer by spin-coating a conductive layer solution on the HSQ resist:
a process of patterning the conductive layer and the HSQ resist; and
a process of developing the conductive layer and the HSQ resist.

2. The method of claim 1, wherein the process of etching lithium niobate is performed using ICP etching equipment, and in this case, an ICP power is 300 W to 1000 W, and a bias power is 50 W to 300 W.

3. The method of claim 1, wherein the process of etching lithium niobate is performed using magnetron plasma etching equipment, and in this case, an electromagnetic intensity is 10 Gauss to 70 Gauss, and a bias power is 50 W to 300 W.

4. The method of claim 1, wherein the forming of the mask pattern further comprises:
a process of treating the surface of the adhesive film with $O_2$ plasma after the process of forming the adhesive film; and
a process of heating the HSQ resist using a hot plate at 80° C. to 200° C. after the process of spin-coating the HSQ resist.

5. The method of claim 1, wherein the adhesive film is formed as a silicon dioxide film ($SiO_2$) using a plasma-enhanced chemical vapor deposition (PECVD) method.

6. The method of claim 1, further comprising a process of stabilizing the chamber by performing a multiple Ar purge process prior to the process of etching lithium niobate.

7. The method of claim 6, wherein the multiple Ar purge process comprises:
a process of operating a vacuum pump under atmospheric pressure conditions, and then injecting Ar gas until the chamber internal pressure becomes 100 Torr, and then repeatedly performing an Ar purge process of operating the vacuum pump at least three times; and
a process of injecting Ar gas up to the process pressure.

8. A method for forming a lithium niobate pattern, the method comprising: a process of forming a lithium niobate pattern using the method according to claim 1; and
a cleaning process of removing a redeposited layer in which byproducts generated in the process of forming the lithium niobate pattern are redeposited on the lithium niobate pattern.

9. The method of claim 8, wherein the cleaning process is performed using a KOH aqueous solution.

10. The method of claim 8, further comprising a process of restoring the transparency of the lithium niobate, which is changed by damage caused during the process of etching lithium niobate, by performing a heat treatment process after the process of forming the lithium niobate pattern.

11. The method of claim 10, wherein the heat treatment process is performed at 500° C. to 900° C. in an $O_2$ flow gas environment.

12. A method for etching lithium niobate, the method comprising:
- a process of etching lithium niobate using a mask pattern, as a physical dry etching method using Ar plasma produced in a chamber through a mixed gas in which Ar gas and $O_2$ gas are mixed at a volume ratio of 1:0.5 to 1:2,
- wherein in the process of etching lithium niobate, a process pressure of the chamber is maintained at 1 mTorr to less than 20 mTorr, and
- a process of forming a mask pattern on the lithium niobate, wherein the forming of the mask pattern comprises:
- a process of forming an adhesive film on the lithium niobate;
- a process of spin-coating an HSQ resist on the adhesive film;
- a process of forming a conductive layer by spin-coating a conductive layer solution on the HSQ resist;
- a process of patterning the conductive layer and the HSQ resist; and
- a process of developing the conductive layer and the HSQ resist.

13. The method of claim 12, wherein the forming of the mask pattern further comprises:
- a process of treating the surface of the adhesive film with $O_2$ plasma after the process of forming the adhesive film; and
- a process of heating the HSQ resist using a hot plate at 80° C. to 200° C. after the process of spin-coating the HSQ resist.

14. The method of claim 12, wherein the adhesive film is formed as a silicon dioxide film ($SiO_2$) using a plasma-enhanced chemical vapor deposition (PECVD) method.

* * * * *